(12) United States Patent
Kim et al.

(10) Patent No.: US 9,000,414 B2
(45) Date of Patent: Apr. 7, 2015

(54) LIGHT EMITTING DIODE HAVING HETEROGENEOUS PROTRUSION STRUCTURES

(71) Applicant: Korea Photonics Technology Institute, Gwangju (KR)

(72) Inventors: Sang-Mook Kim, Gwangju (KR); Jong-Hyeob Baek, Daejeon (KR)

(73) Assignee: Korea Photonics Technology Institute, Gwangju (KR)

( * ) Notice: Subject to any disclaimer, the term of this patent is extended or adjusted under 35 U.S.C. 154(b) by 0 days.

(21) Appl. No.: 13/679,698

(22) Filed: Nov. 16, 2012

(65) Prior Publication Data

US 2014/0138613 A1    May 22, 2014

(51) Int. Cl.
| | | |
|---|---|---|
| *H01L 29/06* | (2006.01) | |
| *H01L 31/0328* | (2006.01) | |
| *H01L 31/0336* | (2006.01) | |
| *H01L 31/072* | (2012.01) | |
| *H01L 31/109* | (2006.01) | |
| *H01L 29/22* | (2006.01) | |
| *H01L 33/00* | (2010.01) | |
| *H01L 33/22* | (2010.01) | |
| *H01L 33/24* | (2010.01) | |

(52) U.S. Cl.
CPC .............. *H01L 33/22* (2013.01); *H01L 33/005* (2013.01); *H01L 33/24* (2013.01)

(58) Field of Classification Search
USPC ........................ 257/13, 94, E33.016, E33.027, 257/E33.032, E33.034, E33.048, E33.067, 257/E33.072, E33.074, 21, 95, E31.13
See application file for complete search history.

(56) References Cited

U.S. PATENT DOCUMENTS

| | | | | |
|---|---|---|---|---|
| 4,554,059 | A * | 11/1985 | Short et al. ..................... | 438/408 |
| 6,194,241 | B1 * | 2/2001 | Tsutsui et al. .................. | 438/46 |
| 6,312,967 | B1 * | 11/2001 | Ikeda ............................... | 438/22 |
| 6,442,184 | B1 * | 8/2002 | Ota et al. ................... | 372/43.01 |
| 6,495,862 | B1 * | 12/2002 | Okazaki et al. ................ | 257/103 |
| 6,555,846 | B1 * | 4/2003 | Watanabe et al. ................ | 257/94 |
| 6,569,704 | B1 * | 5/2003 | Takeuchi et al. ................ | 438/94 |
| 6,821,804 | B2 * | 11/2004 | Thibeault et al. ............... | 438/29 |
| 6,847,057 | B1 * | 1/2005 | Gardner et al. ................. | 257/99 |
| 7,079,718 | B2 * | 7/2006 | Welch et al. .................... | 385/14 |
| 7,161,188 | B2 * | 1/2007 | Orita ............................... | 257/98 |
| 7,244,957 | B2 * | 7/2007 | Nakajo et al. ................... | 257/13 |
| 7,345,321 | B2 * | 3/2008 | Wu et al. ......................... | 257/99 |
| 7,541,206 | B2 * | 6/2009 | Yoon et al. ...................... | 438/29 |
| 7,732,802 | B2 * | 6/2010 | Cho et al. ........................ | 257/13 |

(Continued)

FOREIGN PATENT DOCUMENTS

CN              101814426  A  *  8/2010

OTHER PUBLICATIONS

Luminescent Thin Film Screen for Display Applications, IBM Technical Disclosure Bulletin, vol. 24, Issue 10, pp. 4972-4973, Mar. 1, 1982.*

*Primary Examiner* — Ida M Soward
(74) *Attorney, Agent, or Firm* — NSIP Law

(57) ABSTRACT

An object of the present invention is to provide a light emitting diode having a heterogeneous material structure and a method of manufacturing thereof, in which efficiency of extracting light to outside is improved by forming depressions and prominences configured of heterogeneous materials different from each other before or in the middle of forming a semiconductor material on a substrate in order to improve the light extraction efficiency.

6 Claims, 10 Drawing Sheets

(56) References Cited

U.S. PATENT DOCUMENTS

| | | | |
|---|---|---|---|
| 7,989,238 B2* | 8/2011 | Okuno | 438/29 |
| 7,989,826 B2* | 8/2011 | Cheong | 257/95 |
| 8,076,686 B2* | 12/2011 | Yu et al. | 257/98 |
| 8,124,312 B2* | 2/2012 | Ishikawa et al. | 430/270.1 |
| 8,198,649 B2* | 6/2012 | Kim et al. | 257/103 |
| 8,222,654 B2* | 7/2012 | Lee | 257/94 |
| 8,421,107 B2* | 4/2013 | Shinohara et al. | 257/98 |
| 8,426,887 B2* | 4/2013 | Son | 257/103 |
| 8,487,324 B2* | 7/2013 | Lo et al. | 257/88 |
| 8,633,501 B2* | 1/2014 | Ou et al. | 257/98 |
| 8,678,617 B2* | 3/2014 | Lai | 362/249.02 |
| 8,742,442 B2* | 6/2014 | Wei et al. | 257/98 |
| 2005/0263778 A1* | 12/2005 | Hata et al. | 257/79 |
| 2006/0118803 A1* | 6/2006 | Lee et al. | 257/98 |
| 2006/0202219 A1* | 9/2006 | Ohashi et al. | 257/98 |
| 2007/0194324 A1* | 8/2007 | Kim et al. | 257/79 |
| 2007/0267640 A1* | 11/2007 | Lee et al. | 257/94 |
| 2008/0224151 A1* | 9/2008 | Hata et al. | 257/86 |
| 2008/0248603 A1* | 10/2008 | Kunisato et al. | 438/46 |
| 2008/0283865 A1* | 11/2008 | Yoo et al. | 257/103 |
| 2009/0026475 A1* | 1/2009 | Yamaguchi et al. | 257/98 |
| 2009/0261363 A1* | 10/2009 | Chen et al. | 257/95 |
| 2010/0019263 A1* | 1/2010 | Yeh et al. | 257/98 |
| 2010/0032651 A1* | 2/2010 | Okamura et al. | 257/21 |
| 2010/0224251 A1* | 9/2010 | Funakoshi | 136/261 |
| 2010/0230864 A1* | 9/2010 | Park et al. | 264/447 |
| 2011/0073894 A1* | 3/2011 | Chu et al. | 257/98 |
| 2011/0156000 A1* | 6/2011 | Cheng | 257/13 |
| 2011/0220944 A1* | 9/2011 | Choi et al. | 257/98 |
| 2011/0291072 A1* | 12/2011 | Kim | 257/13 |
| 2012/0138988 A1* | 6/2012 | Lee et al. | 257/98 |
| 2012/0273818 A1* | 11/2012 | Wei et al. | 257/98 |
| 2012/0305942 A1* | 12/2012 | Lo et al. | 257/77 |
| 2014/0000689 A1* | 1/2014 | Lee et al. | 136/255 |
| 2014/0103376 A1* | 4/2014 | Ou et al. | 257/95 |
| 2014/0170799 A1* | 6/2014 | Teramae et al. | 438/69 |

* cited by examiner (a)

(b)

(c)

LIGHT EMITTING DIODE HAVING HETEROGENEOUS PROTRUSION STRUCTURES

BACKGROUND OF THE INVENTION

1. Field of the Invention

The present invention relates to a light emitting diode having a heterogeneous material structure and a method of manufacturing thereof, and more specifically, to a light emitting diode having a heterogeneous material structure and a method of manufacturing thereof, in which efficiency of extracting light to outside is improved by forming depressions and prominences configured of heterogeneous materials different from each other before or in the middle of forming a semiconductor material on a substrate in order to improve the light extraction efficiency.

2. Background of the Related Art

Recently, lighting instruments or the like configured with light emitting diodes (LED) have a long lifespan, consume low power compared with conventional incandescent or fluorescent lamps, do not discharge contaminants in the manufacturing process, and thus demands thereon explosively increase. The light emitting diodes are applied to backlight elements of lighting apparatuses or LCD display apparatuses, as well as display apparatuses which use luminescence, and their application fields are gradually diversified.

The light emitting diode is a kind of solid element which transforms electrical energy into light and generally includes an active layer of a semiconductor material intervened between two opposing doping layers. If bias is applied to the two doping layers, holes and electrons are injected into the active layer, and light is emitted when the holes and the electrons are recombined. The light generated at the active layer is emitted in all directions out of a semiconductor chip through all exposed surfaces.

FIG. 1 is an exemplary view showing a process of manufacturing a general light emitting diode. As shown in FIG. 1a, after growing an n-type semiconductor layer 102 on a sapphire substrate 101, an active layer of an InGaN/GaN nitride multiple quantum well 103 structure is formed to emit light by combination of electrons and holes, and a p-type semiconductor layer 104 is formed thereon.

Next, as shown in FIG. 1b, mesa etching is performed using photo lithography in order to form an electrode by exposing an area of the n-type semiconductor layer 102.

Then, as shown in FIG. 1c, an n-type electrode 105 is formed on the top of the n-type semiconductor layer 102 of the mesa etched area, and a thin p-type metal film 106 capable of transmitting light is coated on the p-type semiconductor layer 104. Then, a thick p-type electrode 107 is deposited on the top of the p-type metal film 106.

As an important means for enhancing light extraction efficiency in such a conventional structure, particularly in a nitride-based LED structure, approaches to maximize internal quantum efficiency of the active layer and approaches to extract light generated in the active layer out of the LED chip as much as possible are tried.

There are largely two factors which determine the light extraction efficiency in a light emitting diode. The first one is optical loss in a current diffusion layer related to a transmittance degree, and the second one is optical loss caused by total reflection on an interface through which light is emitted.

In relation to the first factor, an Ni/Au alloy layer or the like having a thickness of some nm to some tens of nm is frequently used as a current diffusion layer in a conventional LED, and it has a transmittance of 60 to 80% with respect to an emission wavelength depending on thickness and alloy conditions.

Although an approach to use an electrode material of high transmittance such as ITO or the like is made recently in order to overcome such a phenomenon, there is a problem in commercializing the electrode material due to high contact resistance against the p-type semiconductor (GaN) layer, and thus techniques employing a structure such as an n-p tunnel junction or an InGaN/GaN super lattice are applied.

The optical loss caused by total reflection in relation to the second factor is generated due to difference in refractive index between adjacent materials at an interface which emits light from the top of a light emitting diode to outside, i.e., an interface between p-type GaN and resin, p-type GaN and air or other material contacted with the p-type GaN, or an interface between a buffer layer and the sapphire substrate positioned at a lower part of the LED element.

A semiconductor constituting a general light emitting diode has a high refractive index compared with external environments such as a substrate, an epoxy, an air layer and the like, and thus most of photons generated by combination of electrons and holes stay inside the (LED) element. Therefore, external quantum efficiency is greatly affected by the structural shape of the element and optical characteristics of the materials constituting the element.

Particularly, since the refractive index of a material constituting a nitride semiconductor light emitting diode is higher than that of the materials surrounding the light emitting diode (e.g., air, resin, substrate, etc), the photons generated inside the light emitting diode do not escape to outside and is absorbed inside the light emitting diode, and thus the light emitting diode has low external quantum efficiency (extraction efficiency).

One of conventional approaches for reducing optical loss generated by total reflection is a method of patterning a shape of regular or irregular depressions and prominences in an area of a p-type GaN layer using a process such as etching or the like in order to change an incident or emission angle at an interface.

However, particularly, in the case of a nitride semiconductor optical device, when the surface is coarsely processed in a dry or wet etching method due to the relatively thin p-type semiconductor layer, a defect can be induced in the active layer placed right below the p-type semiconductor layer, and contact resistance can be increased due to changes in the characteristics of the p-type semiconductor layer.

Therefore, in the case of a nitride semiconductor, since there is a limit in the method of coarsely processing the surface after growing a thin film, a method of coarsely processing the surface in the course of depositing a thin film is employed.

This is a method which improves brightness compared with a conventional LED by evenly growing the substrate and the layers formed thereon except the last thin film and densely forming pits on the surface by changing growth conditions such as a III-V group ratio, temperature, deposition speed and the like when the last thin film is grown.

However, this method has a problem in that the process of densely forming the pits is complicated.

SUMMARY OF THE INVENTION

Therefore, the present invention has been made in view of the above problems, and it is an object of the present invention to provide a light emitting diode having a heterogeneous material structure and a method manufacturing thereof, in which efficiency of extracting light to outside is improved by forming depressions and prominences configured of heterogeneous materials different from each other before or in the middle of forming a semiconductor material on a substrate in order to improve the light extraction efficiency.

To accomplish the above object, according to one aspect of the present invention, there is provided a light emitting diode having a heterogeneous material structure, including: a substrate; an n-type semiconductor layer formed on the substrate; an active layer formed on the n-type semiconductor layer; a p-type semiconductor layer formed on the active layer; a transparent electrode layer formed on the p-type semiconductor layer; a first electrode layer formed on the transparent electrode layer; and a second electrode layer formed in an area where the n-type semiconductor layer is exposed by etching the transparent electrode layer, the p-type semiconductor layer and the active layer; wherein a protrusion formed of heterogeneous materials having different refractive indexes is formed on at least one of the substrate and the semiconductor layers.

In addition, the protrusion contains two or more materials selected among sapphire, silicon carbide, gallium nitride (GaN), aluminum gallium nitride (AlGa1-xN, 0<=x<=1), gallium arsenic (GaAs), chrome (Cr), silicon oxide (SiO2), silicon nitride ($Si_3N_4$), silicon oxynitride (SiON), hafnium oxide (HfO), silver (Ag) and aluminum (Al).

In addition, the substrate contains at least one of materials selected among sapphire, silicon carbide, gallium arsenic (GaAs), gallium nitride (GaN) and silicon (Si).

In addition, the flat surface of the protrusion is formed in a shape of a circle, a triangle, a rectangle or a polygon or in a shape of a point of a vertex.

In addition, there is provided a method of manufacturing a light emitting diode having a heterogeneous material structure, the method including the steps of: patterning a protruded pattern so that a first etch mask material having a certain refractive index may remain on a top surface of a substrate; forming an n-type semiconductor layer on the substrate; forming an active layer on the n-type semiconductor layer; forming a p-type semiconductor layer on the active layer; forming a transparent electrode layer on the p-type semiconductor layer; etching a predetermined area of the transparent electrode layer, the active layer and the p-type semiconductor layer; forming a first electrode layer on the transparent electrode layer; and forming a second electrode layer in the area where the n-type semiconductor layer is exposed by etching the transparent electrode layer, the active layer and the p-type semiconductor layer.

In addition, the method of manufacturing a light emitting diode further includes the step of forming a buffer layer, after the step of patterning a protruded pattern so that a first etch mask material having a certain refractive index may remain on a top surface of a substrate.

In addition, the step of patterning a protruded pattern so that a first etch mask material having a certain refractive index may remain on a top surface of a substrate includes the steps of: depositing the first etch mask material on the substrate; patterning on the substrate; partially etching the first etch mask material so that the first etch mask material may remain on a top of the pattern formed by the patterning step; etching the substrate; and cleaning the etched substrate.

In addition, the step of etching the first etch mask material includes the steps of: depositing a second etch mask material having a certain refractive index on the top surface of the substrate where the first etch mask material remains; patterning on the substrate; and partially etching the second etch mask material so that the second etch mask material may remain on the top of the pattern formed by the patterning step.

In addition, the first and second etch mask materials contain at least two or more materials selected among chrome (Cr), silicon dioxide (SiO2), silicon nitride (Si3N4), silicon oxynitride (SiON), hafnium oxide (HfO), silver (Ag) and aluminum (Al).

Figure 1:
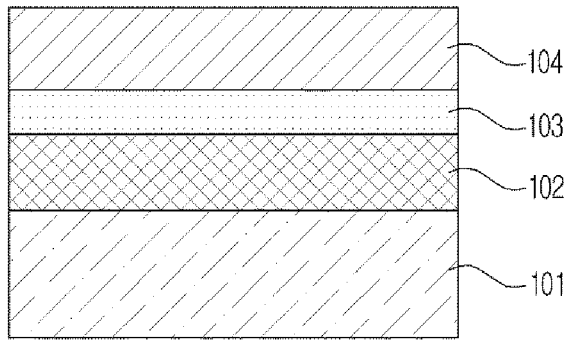
FIGS. 1a, 1b and 1c are exemplary views showing a process of manufacturing a general light emitting diode.
Figure 1:
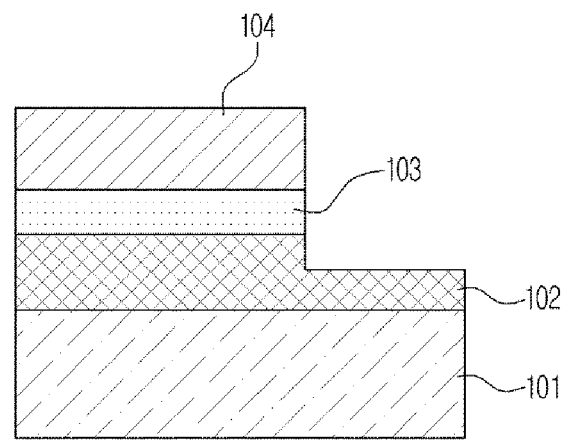
Figure 1:
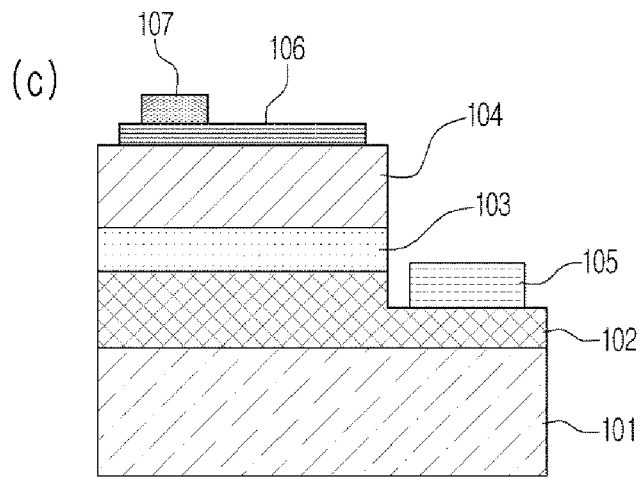

DESCRIPTION OF SYMBOLS 110, 210, 310, 510: Substrate
111: Groove
120, 120a, 120b, 220, 320, 520: Protrusion
130, 230, 330, 530: Etch mask material
140, 540: Buffer layer
150, 550: N-type semiconductor layer
160, 560: Active layer
170, 570: P-type semiconductor layer
180, 580: Transparent electrode
191, 591: First electrode
192, 592: Second electrode
410: Bottom width of protrusion
420: Height of protrusion
430: Distance between protrusions

DETAILED DESCRIPTION OF THE PREFERRED EMBODIMENT

The preferred embodiments of a light emitting diode having a heterogeneous material structure and a method of manufacturing thereof according to the invention will be hereafter described in detail with reference to the accompanying drawings.

(First Embodiment)

Figure 2:
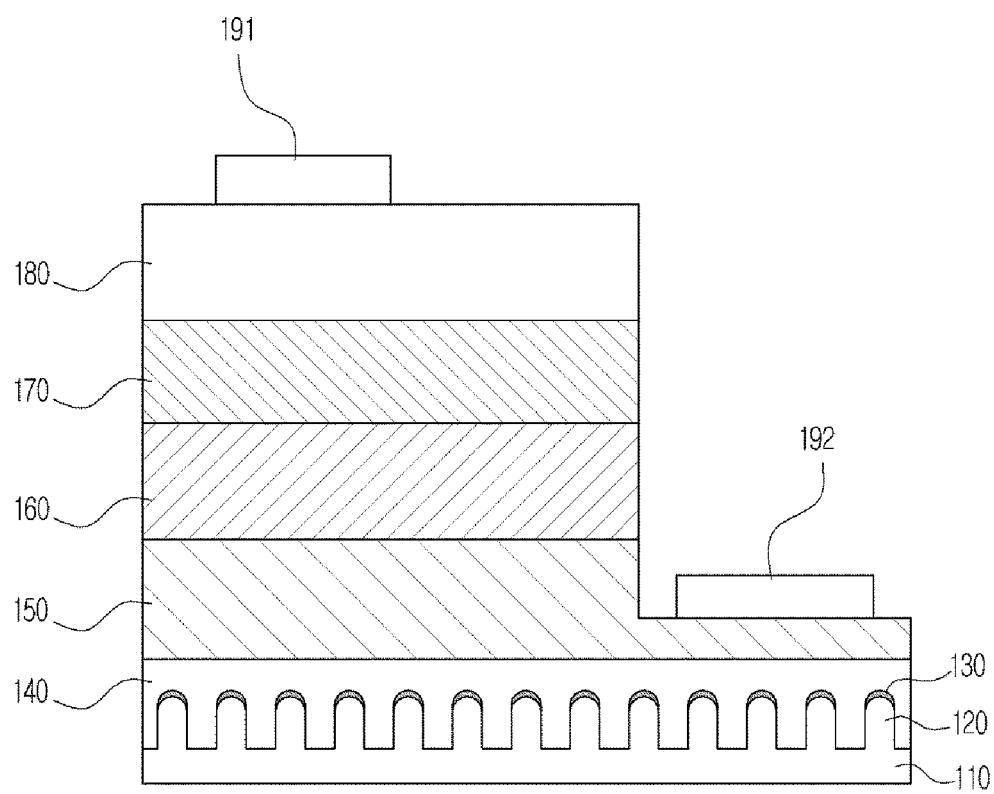
FIG. 2 is a view showing the configuration of a light emitting diode having a heterogeneous material structure according to a first embodiment of the present invention.

FIG. 2 is a view showing the configuration of a light emitting diode having a heterogeneous material structure according to a first embodiment of the present invention.

After forming a protrusion 120 of a prominence shape by performing a patterning process on a substrate 110, the substrate 110 and an etch mask material 130 are partially etched when performing an etching process so that the etch mask material may remain on the top of the protrusion 120 of a prominence shape, and thus the protrusion 120 is formed on the top of the substrate.

The substrate 110 is formed of at least one of materials selected among sapphire, silicon carbide, gallium arsenic (GaAs), gallium nitride (GaN), aluminum gallium nitride (AlGa1-xN, 0<=x<=1) and silicon (Si) and preferably formed of a sapphire substrate.

In addition, the protrusion 120 patterned on the substrate 110 is formed through a patterning process, and the flat surface of the protrusion 120 is formed in a shape of a circle, a triangle, a rectangle or a polygon or in a shape of a point of a vertex.

A buffer layer 140, an n-type semiconductor layer 150, an active layer 160 and a p-type semiconductor layer 170 are sequentially stacked on the substrate formed with the protrusion 120 on the top, and at this point, it can be formed using a metal organic chemical vapor deposition (MOCVD) method. Next, a transparent electrode 180 is formed on the top of the p-type semiconductor layer 170.

After sequentially stacking the n-type semiconductor layer 150, the active layer 160, the p-type semiconductor layer 170 and the transparent electrode 180 in order to form a second electrode 192, a certain area of the transparent electrode 180, the p-type semiconductor layer 170 and the active layer 160 is etched so that the n-type semiconductor layer 150 may be exposed. At this point, a wet etching method or a dry etching method can be used.

Then, a first electrode 191 is formed on the transparent electrode 180, and the second electrode 192 is formed on the n-type semiconductor layer 150 that is exposed by etching a certain area of the transparent electrode 180, the p-type semiconductor layer 170 and the active layer 160.

If the light emitting diode is completed as described above and voltage is applied through the first electrode 191 and the second electrode 192, photons are emitted by the recombination of electrons and holes at the active layer 160.

That is, as the voltage is applied to the p-n junction in the forward direction, electrons of the n-type semiconductor layer 150 and holes of the p-type semiconductor layer 170 are injected toward the p side and the n side, and the photons generated by the electrons and holes recombined at the active layer 160 are emitted toward outside of the element.

At this point, the photons generated at the active layer 160 and move toward the substrate are extracted outside while being refracted and scattered when the photons collide with the protrusion 120 formed on the surface of the substrate, and since there is almost no flat area due to the pattern of the protrusion 120 formed on the surface of the substrate, efficiency of emitting the light, which is entered into the substrate, out of the element is improved.

Figure 3:
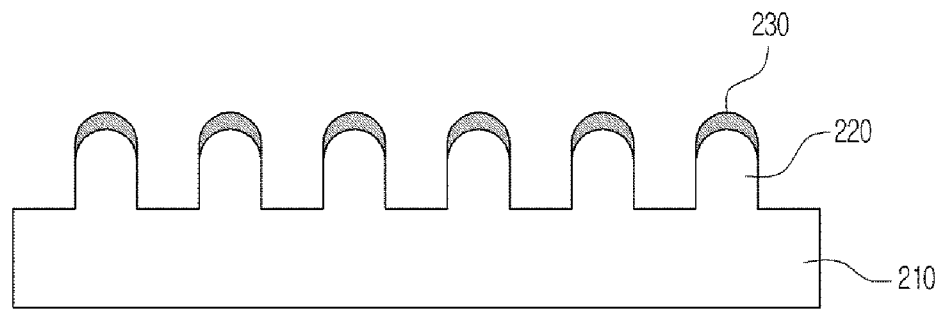
FIG. 3 is a cross-sectional view showing the substrate of a light emitting diode having a heterogeneous material structure according to FIG. 2.

FIG. 3 is a cross sectional view showing the substrate of a light emitting diode having a heterogeneous material structure according to FIG. 2.

A patterning process and a texturing process should be performed in order to form the protrusion 200 having a heterogeneous material structure on a substrate 210.

First, an etch mask material 230 is applied on the substrate 210, and a pattern is formed thereon. The pattern can be formed using E-beam, a scanner, a stepper, laser holography or the like.

Subsequently, a mask etching step is performed. The etching process is partially performed to etch only the mask material in an area where it is not that a pattern is formed so as to remain the first etch mask material 230 on the top of the pattern. Then, if a step of etching the substrate 210 is performed, the etch mask material 230 remains on the top of the protrusion 220, and thus the protrusion 220 stacking heterogeneous materials can be formed.

Figure 4:
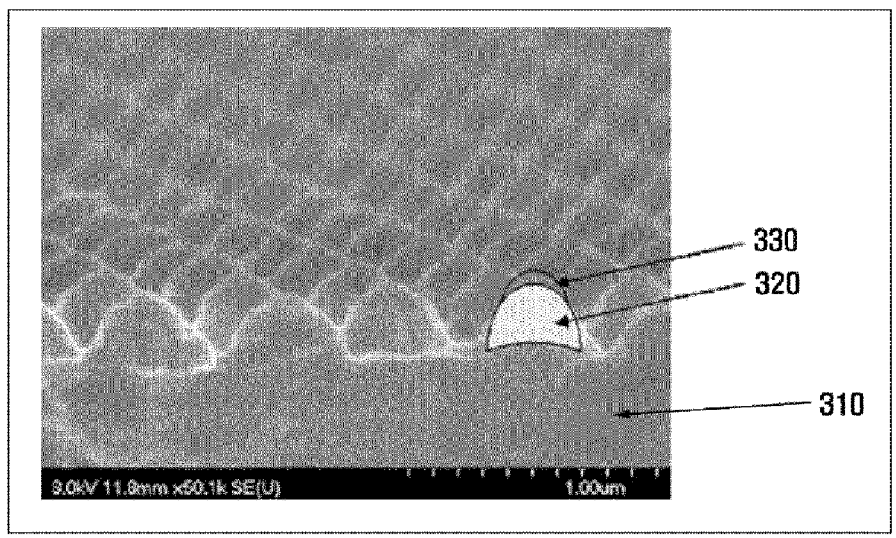
FIG. 4 is an exemplary view showing an SEM image of the substrate of a light emitting diode having a heterogeneous material structure according to FIG. 2.

FIG. 4 is an exemplary view showing an SEM image of the substrate of a light emitting diode having a heterogeneous material structure according to FIG. 2.

Referring to the image, it is understood that a protrusion having a structure stacking heterogeneous materials is formed by a protrusion 320 and an etch mask material 330 protruded on the surface of a substrate 310.

As described, owing to the protrusion having a structure stacking heterogeneous materials on the substrate, the surface area of the substrate increases, and thus light extraction efficiency is improved.

In addition, since the protrusion having a structure stacking heterogeneous materials is formed on the top of the protrusion using a mask material having a refractive index different from that of the substrate, the refracting and scattering effect of light is further improved.

The mask material stacked on the protrusion is formed by stacking at least one or more materials used for the substrate such as sapphire, silicon carbide, gallium nitride (GaN), gallium arsenic (GaAs) and the like and one or more materials having a refractive index different from that of the substrate such as chrome (Cr), silicon dioxide (SiO2), silicon nitride (Si3N4), silicon oxynitride (SiON), hafnium oxide (HfO), silver (Ag) and aluminum (Al), and thus the light extraction efficiency is further improved, or the mask material can be configured to improve the light extraction efficiency by stacking materials having a refractive index different from that of the substrate or semiconductor material.

Figure 5:
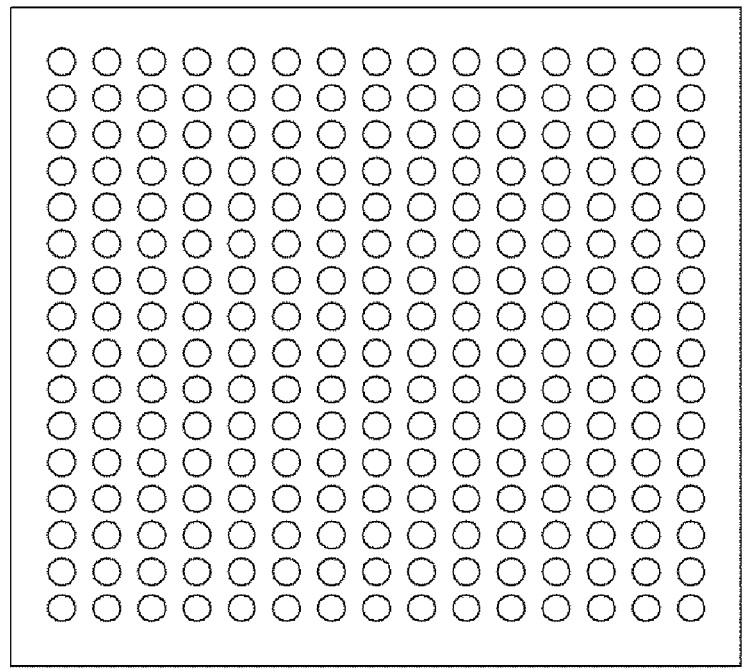
FIG. 5 is a plan view showing the substrate formed with protrusions of a light emitting diode having a heterogeneous material structure according to FIG. 2.
Figure 6:
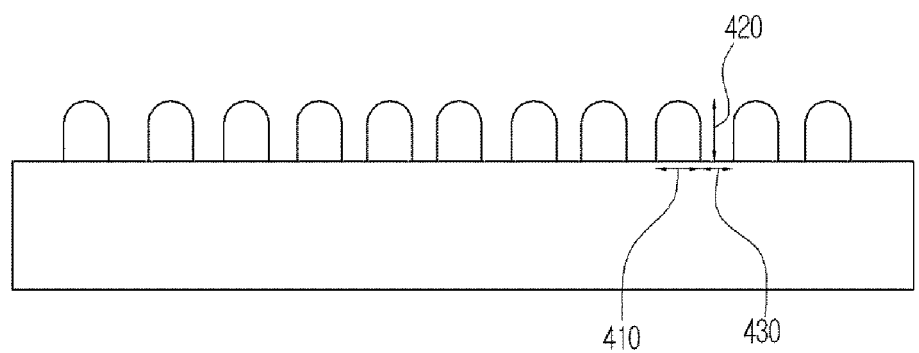
FIG. 6 is a side view showing the substrate of a light emitting diode having a heterogeneous material structure according to FIG. 2.

FIG. 5 is a plan view showing the substrate formed with protrusions of a light emitting diode having a heterogeneous material structure according to FIG. 2, and FIG. 6 is a side view showing the substrate of a light emitting diode having a heterogeneous material structure according to FIG. 2. Although it is preferable that the protrusion having a structure stacking heterogeneous materials has a bottom width 410 of 0.2 to 1 μm, a height 420 of 0.1 to 1 μm, and a distance 430 of 0.05 μm to 1 μm between protrusions, it is not limited thereto.

Figure 7:
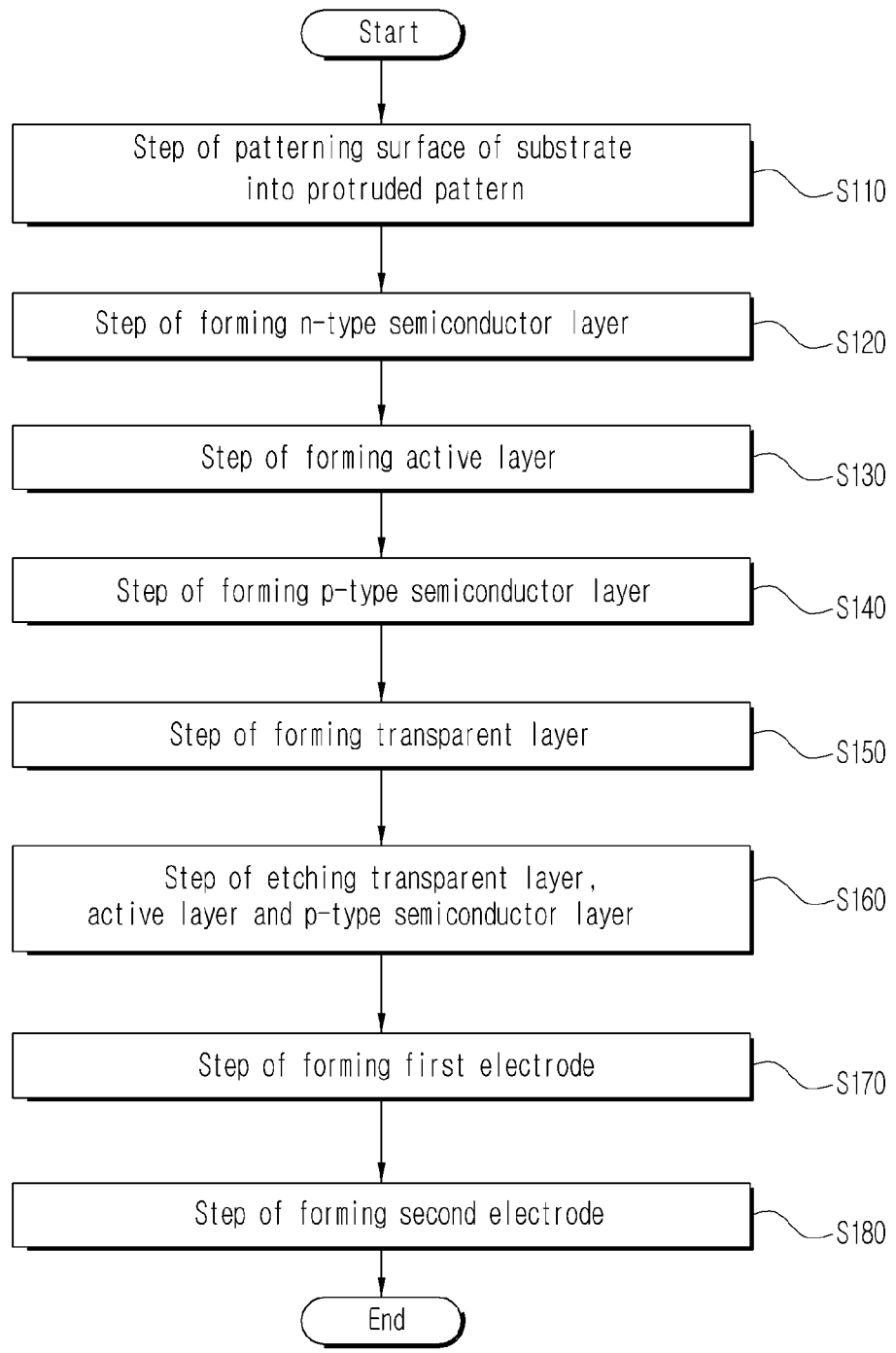
FIG. 7 is a flowchart illustrating a process of manufacturing a light emitting diode having a heterogeneous material structure according to FIG. 2.

FIG. 7 is a flowchart illustrating a process of manufacturing a light emitting diode having a heterogeneous material structure according to FIG. 2.

A step of cleaning the substrate may be performed before the manufacturing process of the invention, and this a step of removing impurities by thermally cleaning the substrate at 1,000 to 1,200° C., which is the growth temperature of GaN.

After the cleaning step, a step of injecting ammonia (NH3) onto the surface of the substrate and nitriding the substrate is performed, and this is to make it easy to grow a GaN nitride-based compound.

After performing the step of cleaning the substrate, a step of patterning the substrate in a pattern formed with protrusions is performed S110.

The pattern of the protrusion may be formed using photo lithography, e-beam lithography, ion-beam lithography, extreme ultraviolet lithography, proximity X-ray lithography or imprint lithography.

In addition, in the mask etching process, the etching process is partially performed so that the etch mask material may remain on the top of the pattern of the protrusion, and if a step of etching the substrate is performed thereafter, the etch mask material remains on the top of the protrusion, and thus a protrusion having a structure stacking heterogeneous materials having refractive indexes different from that of the substrate can be formed.

After performing the patterning step described above, a buffer layer may be selectively formed, and the buffer layer may contribute to securing stability of the element by mitigating the difference in the lattice constants of the substrate and the semiconductor layers.

In addition, the buffer layer may be selected from an AlInN structure, an InGaN/GaN super lattice structure, an InGaN/GaN stacking structure and an AlInGaN/InGaN/GaN stacking structure, and the process of forming the buffer layer is performed at a low temperature of about 400 to 600° C. Then, for growth of a single crystal of the growing GaN layer, the surface of the buffer layer is finished with heat treatment performed at the growth temperature of a clad layer.

After the step of forming the buffer layer, a step of forming an n-type semiconductor layer is performed S120.

The n-type semiconductor layer can be formed as an n-type gallium nitride (n-GaN) layer, doped using silicon (Si) as a dopant, processed at a high temperature, and may combine Ga, N and Si as a compound using ammonia (NH3) as a carrier gas.

After the n-type semiconductor layer is formed, the active layer is formed S130. The active layer may be a semiconductor layer added with a luminescent material of indium gallium nitride (InGaN), and a material such as AlGaN, AlInGaN or the like can be used for the active layer.

At this point, the active layer may be formed in a structure of InGaN/GaN quantum well (QW), and such an active layer may be formed in a multiple quantum well (MQW) structure having a plurality of quantum well structures described above in order to improve brightness.

After the active layer is formed, a p-type semiconductor layer is formed on the active layer S140, and the p-type semiconductor layer may be formed as a gallium nitride layer (p-GaN layer), and magnesium (Mg) can be used as a dopant. The process is also performed at a high temperature, and Ga, N and Mg can be combined into a compound using ammonia (NH3) as a carrier gas.

Such an active layer, for example, supplies NH3, TMGa and trimethyl indium (TMIn) using nitrogen as a carrier gas at a growth temperature of 780° C., and an active layer formed of InGaN/GaN can be grown as thick as 120 Å to 1200 Å.

Then, a transparent electrode layer is formed on the p-type semiconductor layer S150, and the transparent electrode layer is a permeable oxide film and may be formed of at least one or more of ITO, ZnO, RuOx, TiOx and IrOx.

Then, a step of partially etching the layers from the transparent electrode layer to the n-type semiconductor layer is performed in order to form an electrode pad S160, and when a nitride-based semiconductor layer is formed, dry etching is used since wet etching is difficult to use due to the chemical characteristics of nitride-based compounds.

After performing the steps described above, a first electrode is formed on the transparent electrode layer S170, and a second electrode is formed on the n-type semiconductor exposed by partially etching the layers from the transparent electrode layer to the n-type semiconductor layer S180. At this point, an oxidation process can be performed in order to form the electrodes (metallization) and protect the element.

Figure 8:
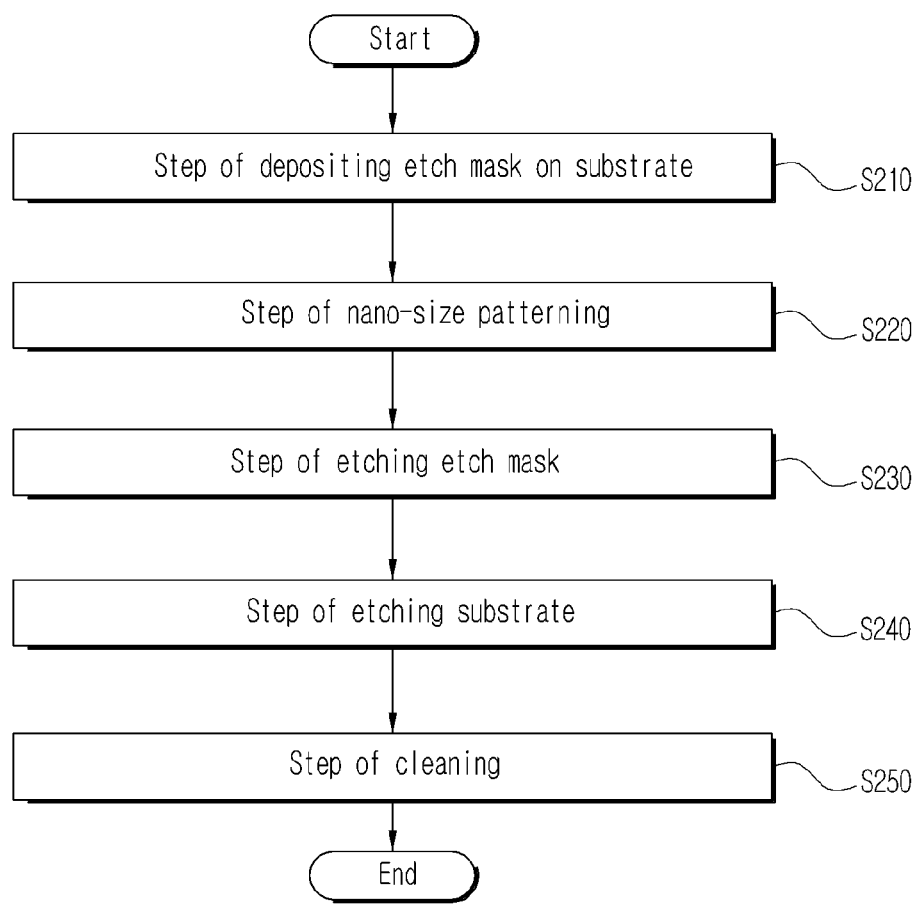
FIG. 8 is a flowchart illustrating a process of patterning a protruded pattern in the process of manufacturing a light emitting diode having a heterogeneous material structure according to FIG. 7.

FIG. 8 is a flowchart illustrating a process of patterning a protruded pattern in the process of manufacturing a light emitting diode having a heterogeneous material structure according to FIG. 7.

The present invention may form a protrusion through a lithography process, and a general lithography process is as described below.

First, a mask (reticle) is manufactured. The mask (reticle) is manufactured by drawing a pattern for forming a projected protrusion on an etch mask material using an E-beam facility, and the mask is deposited on the substrate.

Then, an oxidation process can be added as needed, and a process of developing a thin and uniform silicon oxide film (SiO2) can be added.

Second, a photo resist (PR) is applied, and the PR, which is a material sensitive to light, is uniformly applied on the surface of a wafer.

Third, an exposure process is performed. A process of photographing a pattern of the protrusion on the wafer where the PR is formed is performed by transmitting light through the pattern drawn on the mask using a stepper.

Fourth, membrane of the area receiving light on the surface of the wafer is developed.

Fifth, an etching process for selectively removing unneeded areas is performed using a chemical material or a reactive gas in order to form a protrusion pattern. Such a process of forming a pattern can be repeatedly performed for each pattern layer.

In addition, in the present invention, a photo resistive material such as photo resist (PR) is applied, and this can be patterned into a projected shape by exposing and etching the photo resistive material. In order to form a nano-size pattern, a stepper using deep ultraviolet (DUV) or extreme ultraviolet (EUV) rays having a shorter wavelength or a laser having a further shorter wavelength can be used.

Referring to the figure, a step of depositing an etch mask on the substrate is performed S210, and in the present invention, an etch mask material is formed of one or more materials selected among chrome (Cr), silicon dioxide (SiO2), silicon nitride (Si3N4), silicon oxynitride (SiON), hafnium oxide (HfO), silver (Ag) and aluminum (Al).

The etch mask material is formed to be stacked on the top of the protrusion in the projected protrusion pattern, and a material having a refractive index different from that of the substrate should be used to improve light extraction efficiency using the excellent refracting and scattering effect of light.

After performing the step of depositing an etch mask, a patterning step is performed S220. The projected protrusion pattern forms a projected protrusion using any one of methods selected among photo lithography, e-beam lithography, ion-beam lithography, extreme ultraviolet lithography, proximity X-ray lithography or imprint lithography.

In addition, an area that should not be etched through the mask process is prepared on the substrate, and finally, a protruded structure may be formed on the surface of the substrate by partially cutting off the surface of the substrate in a top-down method or through an etching process.

Then, a step of etching the etch mask is performed S230. At this point, in order to form the projected protrusion, the step of etching the etch mask material should partially etch the etch mask material so that the etch mask material may remain on the top of the protrusion.

Next, a step of etching the substrate is performed S240. If the substrate is etched to a predetermined depth and length using an etchant, a further complete protrusion is formed.

Next, a cleaning step is performed S250. The cleaning step can be performed using an organic solvent such as acetone, alcohol, DI water or the like.

(Second Embodiment)

Figure 9:
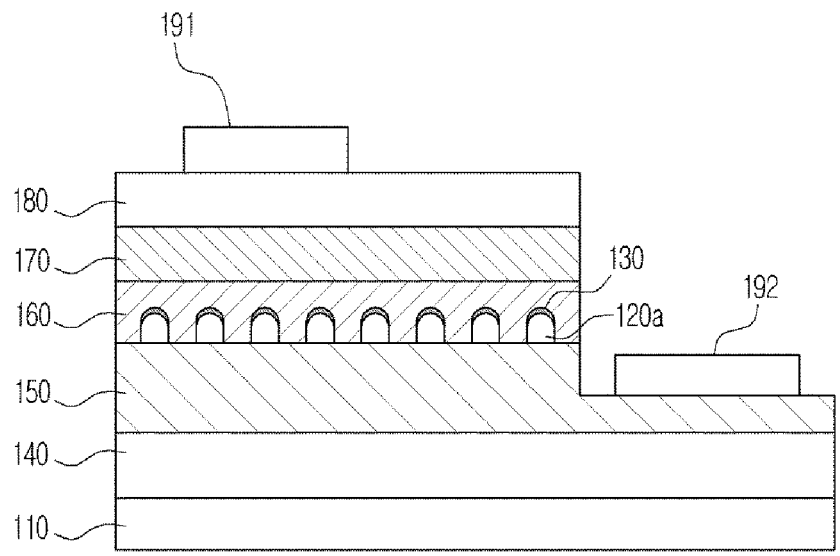
FIG. 9 is a view showing the configuration of a light emitting diode having a heterogeneous material structure according to a second embodiment of the present invention.

FIG. 9 is a view showing the configuration of a light emitting diode having a heterogeneous material structure according to a second embodiment of the present invention. In the figure, elements having like functions of the first embodiment will be denoted by like reference numerals, and details thereon will not be repeated.

A light emitting diode having a heterogeneous material structure according to a second embodiment of the present invention is formed by sequentially stacking a buffer layer 140, an n-type semiconductor layer 150, an active layer 160, a p-type semiconductor layer 170 and a transparent electrode 180 on a substrate 110 without performing a patterning process on the substrate 110. A first electrode 191 is formed on the transparent electrode 180, and a second electrode 192 is formed on the n-type semiconductor layer 150 that is exposed by etching a certain area of the transparent electrode 180, the p-type semiconductor layer 170 and the active layer 160.

In the light emitting diode according to a second embodiment, a structure stacking heterogeneous materials is form on a grown semiconductor, not on the substrate 110. For example, a protrusion 120a of a prominence shape is formed by performing a patterning process on a grown n-type semiconductor layer 150, and then a structure stacking heterogeneous materials is formed on the top of the n-type semiconductor layer 150 by partially etching an etch mask material 130 so that the etch mask material 130a may remain on the top of the protrusion 120a of a prominence shape.

Accordingly, light extraction efficiency can be further improved by stacking one or more materials selected among chrome (Cr), silicon dioxide (SiO2), silicon nitride (Si3N4), silicon oxynitride (SiON), hafnium oxide (HfO), silver (Ag) and aluminum (Al) having a refractive index different from that of the substrate.

(Third Embodiment)

Figure 10:
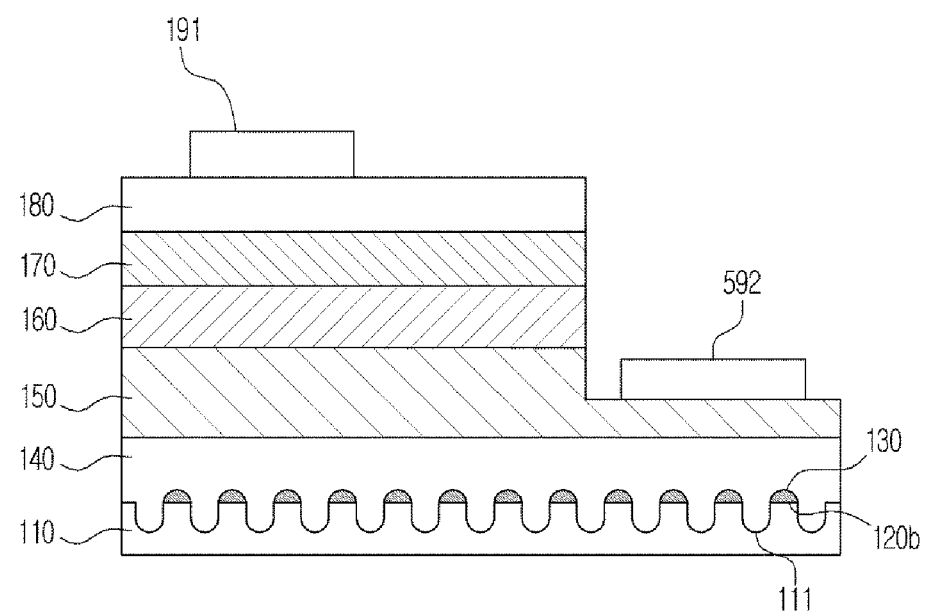
FIG. 10 is a view showing the configuration of a light emitting diode having a heterogeneous material structure according to a third embodiment of the present invention.

FIG. 10 is a view showing the configuration of a light emitting diode having a heterogeneous material structure according to a third embodiment of the present invention. In the figure, elements having like functions of the first embodiment will be denoted by like reference numerals, and details thereon will not be repeated.

A light emitting diode having a heterogeneous material structure according to a third embodiment of the present invention is formed by sequentially stacking a buffer layer 140, an n-type semiconductor layer 150, an active layer 160, a p-type semiconductor layer 170 and a transparent electrode 180 on a substrate 110 without performing a patterning process on the substrate 110. A first electrode 191 is formed on the transparent electrode 180, and a second electrode 192 is formed on the n-type semiconductor layer 150 that is exposed by etching a certain area of the transparent electrode 180, the p-type semiconductor layer 170 and the active layer 160.

In the light emitting diode according to a third embodiment, a groove 111 is formed on the substrate 110, and the flat surface of the substrate where the groove 111 is not formed is configured as a relatively prominent protrusion 120b, and thus the substrate 110 may be formed to have a protruded structure.

That is, a pattern is formed on the substrate 110, and the groove 111 is formed on the top surface of the substrate 110 if an etching step is performed on the substrate 110 where the pattern is not formed. Accordingly, the flat surface of the substrate formed with the pattern forms a protrusion 120b that is relatively prominent compared with the groove 111.

After depositing an etch mask material 130 having a certain refractive index on the substrate 110, the etch mask material 130 is partially etched so that the etch mask material 130 may remain on the top of the protrusion 120b. Therefore, the etch mask material 130 remains on the top of the protrusion 120b, and thus the protrusion 120b stacking heterogeneous materials can be formed.

The protrusion 120b is formed by stacking at least one or more materials selected among chrome (Cr), silicon dioxide (SiO2), silicon nitride (Si3N4), silicon oxynitride (SiON), hafnium oxide (HfO), silver (Ag) and aluminum (Al) having a refractive index different from that of the substrate.

(Fourth Embodiment)

Figure 11:
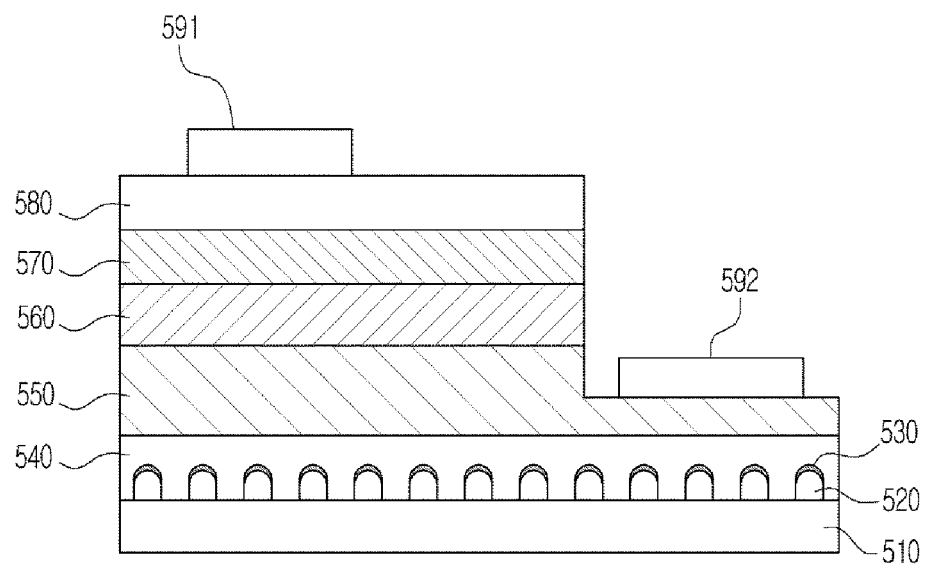
FIG. 11 is a view showing the configuration of a light emitting diode having a heterogeneous material structure according to a fourth embodiment of the present invention.

FIG. 11 is a view showing the configuration of a light emitting diode having a heterogeneous material structure according to a fourth embodiment of the present invention.

After performing a patterning process on a substrate 510 to form a protruded pattern so that a first etch mask material having a certain refractive index different from that of the substrate 510 may remain on the substrate 510, a protrusion 520 is formed on the top of the substrate by partially etching the first etch mask material. After performing a patterning process to form a protruded pattern so that a second etch mask material having a certain refractive index different from those of the substrate 510 and the protrusion 520 may remain on the top of the substrate 510 where the protrusion 520 remains, the second etch mask material is partially etched so that the second etch mask material may remain on the top of the protrusion 520, and thus at least two mask materials having refractive indexes different from each other are configured to protrude on the top of the substrate 510.

The first and second etch mask materials include materials selected among chrome (Cr), silicon dioxide (SiO2), silicon nitride (Si3N4), silicon oxynitride (SiON), hafnium oxide (HfO), silver (Ag) and aluminum (Al).

The substrate 510 is formed of at least one of materials selected among sapphire, silicon carbide, gallium arsenic (GaAs), gallium nitride (GaN) and silicon (Si) and preferably formed of a sapphire substrate.

In addition, the protrusion 520 patterned on the substrate 510 is formed through a patterning process, and the flat surface of the protrusion 520 is formed in a shape of a circle, a triangle, a rectangle or a polygon or in a shape of a point of a vertex.

A buffer layer 540, an n-type semiconductor layer 550, an active layer 560 and a p-type semiconductor layer 570 are sequentially stacked on the substrate formed with the protrusion 520 on the top, and at this point, it can be formed using a metal organic chemical vapor deposition (MOCVD) method. Next, a transparent electrode 580 is formed on the top of the p-type semiconductor layer 570.

After sequentially stacking the n-type semiconductor layer 550, the active layer 560, the p-type semiconductor layer 570 and the transparent electrode 580 in order to form a second electrode 592, a certain area of the transparent electrode 580, the p-type semiconductor layer 570 and the active layer 560 is etched so that the n-type semiconductor layer 550 may be exposed. At this point, a wet etching method or a dry etching method can be used.

Then, a first electrode 591 is formed on the transparent electrode 580, and the second electrode 592 is formed on the n-type semiconductor layer 550 that is exposed by etching a certain area of the transparent electrode 580, the p-type semiconductor layer 570 and the active layer 560.

If the light emitting diode is completed as described above and voltage is applied through the first electrode 591 and the second electrode 592, photons are emitted by the recombination of electrons and holes at the active layer 560.

That is, as the voltage is applied to the p-n junction in the forward direction, electrons of the n-type semiconductor layer 550 and holes of the p-type semiconductor layer 570 are injected toward the p side and the n side, and the photons generated by the electrons and holes recombined at the active layer 560 are emitted toward outside of the element.

At this point, the photons generated at the active layer 560 and move toward the substrate are extracted outside while being refracted and scattered when the photons collide with the protrusion 520 formed on the surface of the substrate, and since there is almost no flat area due to the pattern of the protrusion 520 on the surface of the substrate, efficiency of emitting the light, which is entered into the substrate, out of the element is improved.

Figure 12:
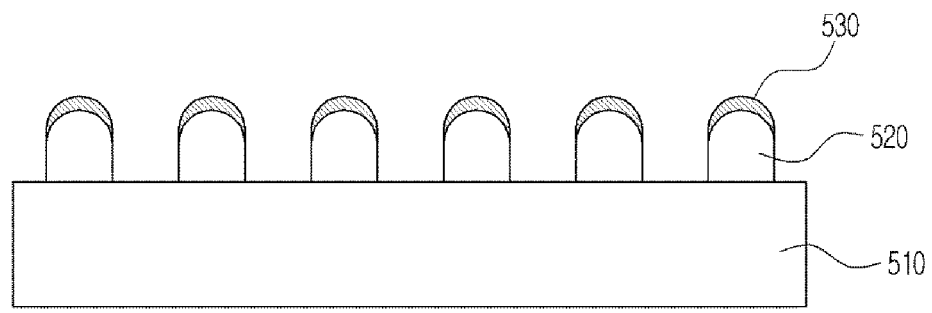
FIG. 12 is a cross-sectional view showing the substrate of a light emitting diode having a heterogeneous material structure according to FIG. 11.

FIG. 12 is a cross sectional view showing the substrate of a light emitting diode having a heterogeneous material structure according to FIG. 11.

A first etch mask material is applied on the substrate 510, and a pattern is formed thereon. The pattern can be formed using E-beam, a scanner, a stepper, laser holography or the like.

Subsequently, a mask etching step is performed. A protrusion 520 is formed by partially performing the etching process to etch only the mask material in an area where it is not that a pattern is formed so as to remain the first etch mask material on the top of the pattern. Then, a second etch mask material is applied, and a pattern is formed thereon. Then, if a second etch mask step is performed, the second etch mask material 530 remains on the top of the protrusion 520, and thus the protrusion 520 stacking heterogeneous materials can be formed.

The first and second etch mask materials are materials selected among chrome (Cr), silicon dioxide (SiO2), silicon nitride (Si3N4), silicon oxynitride (SiON), hafnium oxide (HfO), silver (Ag) and aluminum (Al), and the first and second etch mask materials are heterogeneous mask materials having refractive indexes different from each other.

Figure 13:
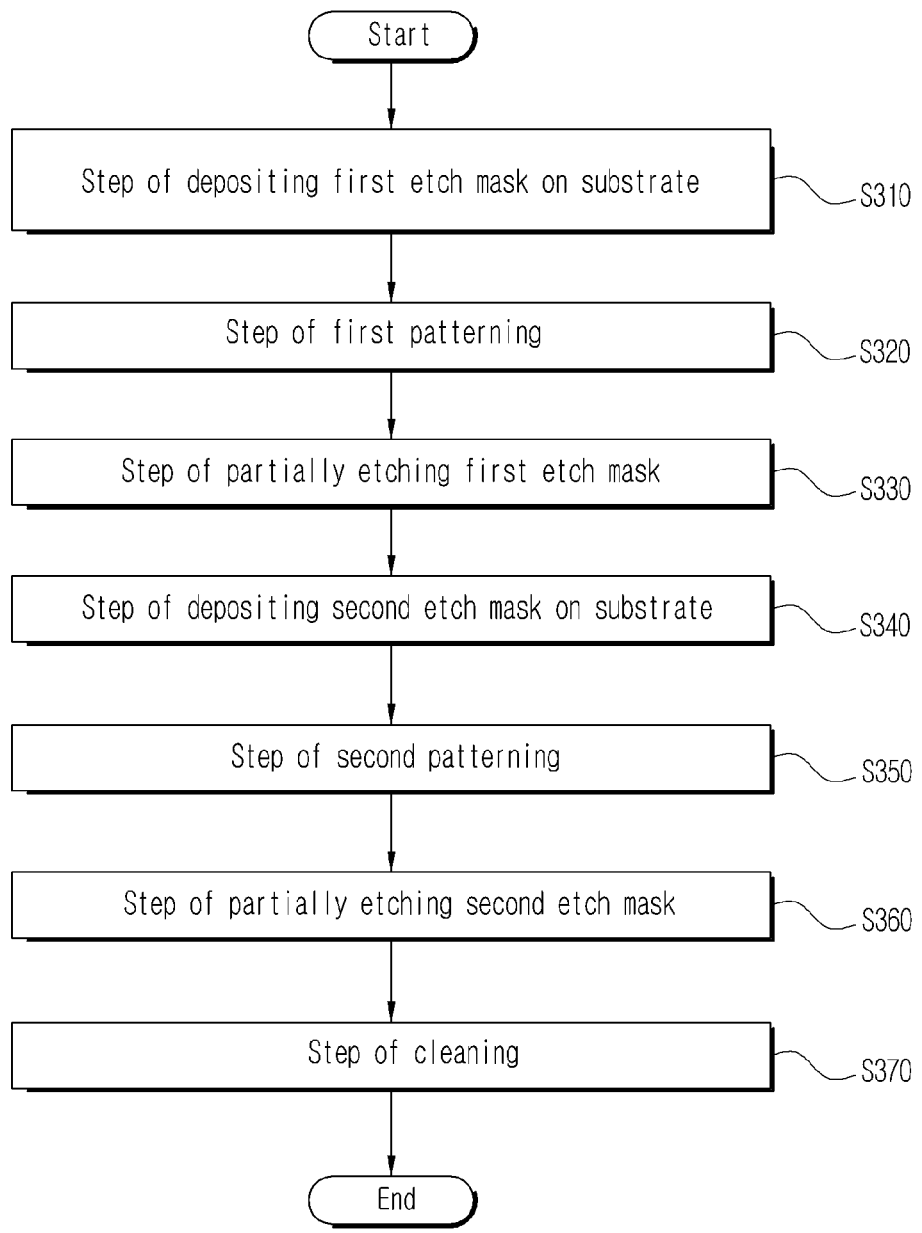
FIG. 13 is a flowchart illustrating a process of patterning a protruded pattern in the process of manufacturing a light emitting diode having a heterogeneous material structure according to FIG. 11.

FIG. 13 is a flowchart illustrating a process of patterning a protruded pattern in the process of manufacturing a light emitting diode having a heterogeneous material structure according to FIG. 11.

Referring to the figure, in the step of patterning the protrusion to form a protruded pattern so that the first etch mask material having a certain refractive index may remain on the top of the substrate, the first etch mask material is deposited on the substrate S310, and the etch mask material is formed of any one of materials selected among chrome (Cr), silicon dioxide (SiO2), silicon nitride (Si3N4), silicon oxynitride (SiON), hafnium oxide (HfO), silver (Ag) and aluminum (Al).

After depositing the first etch mask material, a patterning step is performed S320. The protrusion projected on the substrate is formed by partially etching the first etch mask material S330 so that the first etch mask material may remain on the top of the pattern formed through the patterning of step S320.

A second etch mask material is deposited on the top surface of the substrate where the first etch mask material remains S340. The second etch mask material is a mask material having a refractive index different from that of the substrate, which is formed of any one of materials selected among chrome (Cr), silicon dioxide (SiO2), silicon nitride (Si3N4), silicon oxynitride (SiON), hafnium oxide (HfO), silver (Ag) and aluminum (Al), and it is preferable to deposit an etch mask material different from the first etch mask material.

After depositing the second etch mask material, a patterning step is performed S350. The second etch mask material is partially etched S360 so that the second etch mask material may remain on the top of the pattern formed through the patterning of step S350.

By performing step S360, two types of mask materials respectively having a refractive index different from that of the substrate are stacked on the substrate, and thus light extraction efficiency is improved owing to the excellent refracting and scattering effect of light.

In addition, a protrusion of a further complete form can be created by etching the substrate to a predetermined depth and length using an etchant.

Next, a cleaning step is performed using an organic solvent such as acetone, alcohol, DI water or the like S370.

Accordingly, the refracting and scattering effect of light is improved by stacking the substrate and two types of mask materials respectively having a refractive index different from that of the substrate, and thus a light emitting diode improving the light extraction efficiency can be provided.

In the present invention, a light emitting diode having a heterogeneous material structure is manufactured, and thus defects of semiconductor light emitting diodes are reduced, and the area of a light emitting layer is increased. In addition, brightness of the light emitting diode is improved due to increase in scattering of light.

In addition, the present invention forms depressions and prominences by remaining a mask material having a refractive index different from that of a substrate in order to improve light extraction efficiency, and the depressions and prominences are used as a growth mask when a nitride film or the like is grown. Therefore, it is advantageous for growth of a semiconductor layer such as a high grade nitride film or the like owing to acceleration of lateral growth.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A light emitting diode comprising:
   a substrate;
   an n-type semiconductor layer formed on the substrate;
   an active layer formed on the n-type semiconductor layer;
   a p-type semiconductor layer formed on the active layer;
   a transparent electrode layer formed on the p-type semiconductor layer;
   a first electrode layer formed on the transparent electrode layer;
   a second electrode layer formed in an area where the n-type semiconductor layer is exposed by etching the transparent electrode layer, the p-type semiconductor layer and the active layer;
   a protrusion formed on the p-type semiconductor layer; and
   a mask material formed on the top of the protrusion, wherein
   the mask material has a refractive index that is different from a refractive index of the protrusion.

2. The light emitting diode according to claim 1, wherein the substrate comprises a material selected from the group consisting of sapphire, silicon carbide, gallium arsenic (GaAs), gallium nitride (GaN), aluminum gallium nitride (AlGa$_{1-x}$N, 0≤x≤1), and silicon (Si).

3. The light emitting diode according to claim 1, wherein the protrusion comprises a material selected from the group consisting of chrome (Cr), silicon dioxide (SiO$_2$), silicon nitride (Si$_3$N$_4$), silicon oxynitride (SiON), hafnium oxide (HfO), silver (Ag), and aluminum (Al).

4. The light emitting diode according to claim 1, wherein a flat surface of the protrusion is formed in a shape of a circle, a triangle, a rectangle or a polygon or in a shape of a point of a vertex.

5. The light emitting diode according to claim 1, wherein the protrusion has a bottom width of 0.2 to 1 μm, a height of 0.1 to 1 μm, and a distance of 0.05 μm to 1 μm between protrusions.

6. The light emitting diode according to claim 1, wherein the mask material comprises at least one material selected from the group consisting of chrome (Cr), silicon dioxide (SiO$_2$), silicon nitride (Si$_3$N$_4$), silicon oxynitride (SiON), hafnium oxide (HfO), silver (Ag) and aluminum (Al).

* * * * *